United States Patent
Joshi et al.

(10) Patent No.: US 10,387,596 B2
(45) Date of Patent: Aug. 20, 2019

(54) MULTI-DIMENSION VARIABLE PREDICTIVE MODELING FOR YIELD ANALYSIS ACCELERATION

(71) Applicant: INTERNATIONAL BUSINESS MACHINES CORPORATION, Armonk, NY (US)

(72) Inventors: Rajiv V. Joshi, Yorktown Heights, NY (US); Emrah Acar, Montvale, NJ (US); Colin J. Parris, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 889 days.

(21) Appl. No.: 14/469,399

(22) Filed: Aug. 26, 2014

(65) Prior Publication Data

US 2016/0063156 A1    Mar. 3, 2016

(51) Int. Cl.
*G06F 17/50* (2006.01)
*G06Q 10/04* (2012.01)

(52) U.S. Cl.
CPC ........ *G06F 17/5036* (2013.01); *G06Q 10/04* (2013.01)

(58) Field of Classification Search
None
See application file for complete search history.

(56) References Cited

U.S. PATENT DOCUMENTS

| | | | |
|---|---|---|---|
| 8,290,753 B2 | 10/2012 | Tryon, III et al. | |
| 2004/0002844 A1* | 1/2004 | Jess | G06F 17/5036 703/14 |
| 2004/0259555 A1* | 12/2004 | Rappaport | H04W 16/18 455/446 |
| 2005/0251771 A1 | 11/2005 | Robles | |
| 2005/0257178 A1 | 11/2005 | Daems | |
| 2005/0278664 A1 | 12/2005 | Chaudhry et al. | |
| 2007/0198964 A1 | 8/2007 | Al-Imam et al. | |
| 2007/0220455 A1 | 9/2007 | Joshi | |
| 2008/0195325 A1* | 8/2008 | Joshi | G06F 17/5036 702/19 |
| 2009/0144671 A1* | 6/2009 | Liu | G06F 17/5068 716/132 |
| 2011/0078099 A1* | 3/2011 | Weston | G06F 19/24 706/12 |
| 2011/0296358 A1* | 12/2011 | Dewey, III | G06F 17/5018 716/106 |

(Continued)

OTHER PUBLICATIONS

Rouwaida Kanj, "Mixture Importance Sampling and Its Application to the Analysis of SRAM Designs in the Presence of Rare Failure Events", 2006.*

(Continued)

*Primary Examiner* — Brian W Wathen
*Assistant Examiner* — Abdou K Seye

(57) ABSTRACT

In one example, a method for evaluating a system includes constructing a macro-model of the system comprising a multiple-order polynomial equation that defines a boundary between at least one failure region and a non-failure region for a performance indicator with respect to at least one variable of the system. The method further includes obtaining importance samples for the at least one variable that are biased to the at least one failure region, and calculating indicator values for the performance indicator by applying the importance samples to the macro-model.

15 Claims, 8 Drawing Sheets

(56) References Cited

U.S. PATENT DOCUMENTS

| | | | |
|---|---|---|---|
| 2011/0313747 A1* | 12/2011 | Joshi | G06F 17/5018 |
| | | | 703/14 |
| 2012/0046929 A1* | 2/2012 | Joshi | G06F 17/5022 |
| | | | 703/13 |
| 2012/0079438 A1* | 3/2012 | Paciaroni | G06F 17/5036 |
| | | | 716/103 |
| 2012/0143557 A1* | 6/2012 | Moliere | G06F 17/5081 |
| | | | 702/117 |
| 2013/0226544 A1* | 8/2013 | Mcconaghy | G06F 17/5022 |
| | | | 703/2 |
| 2014/0109030 A1* | 4/2014 | Lee | G06F 17/5036 |
| | | | 716/115 |

OTHER PUBLICATIONS

Debrup Chakraborty et al. "A Neuro-Fuzzy Scheme for Simultaneous Feature Selection and Fuzzy Rule-Based Classification", pp. 110-123; IEEE Transactions on Neural Networks, vol. 15, No. 1, Jan. 2004. (Year: 2004).*

Yin Xiaowei, "Common Cause Failure Model of System Reliability Based on Bayesian Networks", International Journal of Performability Engineering, vol. 6, No. 3, May 2010. pp. 255-268.

* cited by examiner

MULTI-DIMENSION VARIABLE PREDICTIVE MODELING FOR YIELD ANALYSIS ACCELERATION

FIELD OF THE DISCLOSURE

The present invention relates generally to statistical simulation of various systems, including memory and logic design systems, financial systems, systems for predicting disease infection, agricultural production systems, and so forth.

BACKGROUND OF THE DISCLOSURE

With deep technology scaling, statistical simulations play a key role in the analysis of state of the art memory and logic designs. However, statistical simulations for yield analysis purposes may involve many device instances, span a large variability space and require many simulation runs in order to observe a sufficient number of failures. This is especially the case when dealing with rare failure events, e.g., less than one part per million.

SUMMARY OF THE DISCLOSURE

In one example, the present disclosure comprises a method for evaluating a system. For example, the method may include constructing a macro-model of the system that comprises a multiple-order polynomial equation that defines a boundary between at least one failure region and a non-failure region for a performance indicator with respect to at least one variable of the system. The method further includes obtaining importance samples for the at least one variable that are biased to the at least one failure region, and calculating indicator values for the performance indicator by applying the importance samples to the macro-model.

BRIEF DESCRIPTION OF THE DRAWINGS

The teachings of the present disclosure can be readily understood by considering the following detailed description in conjunction with the accompanying drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
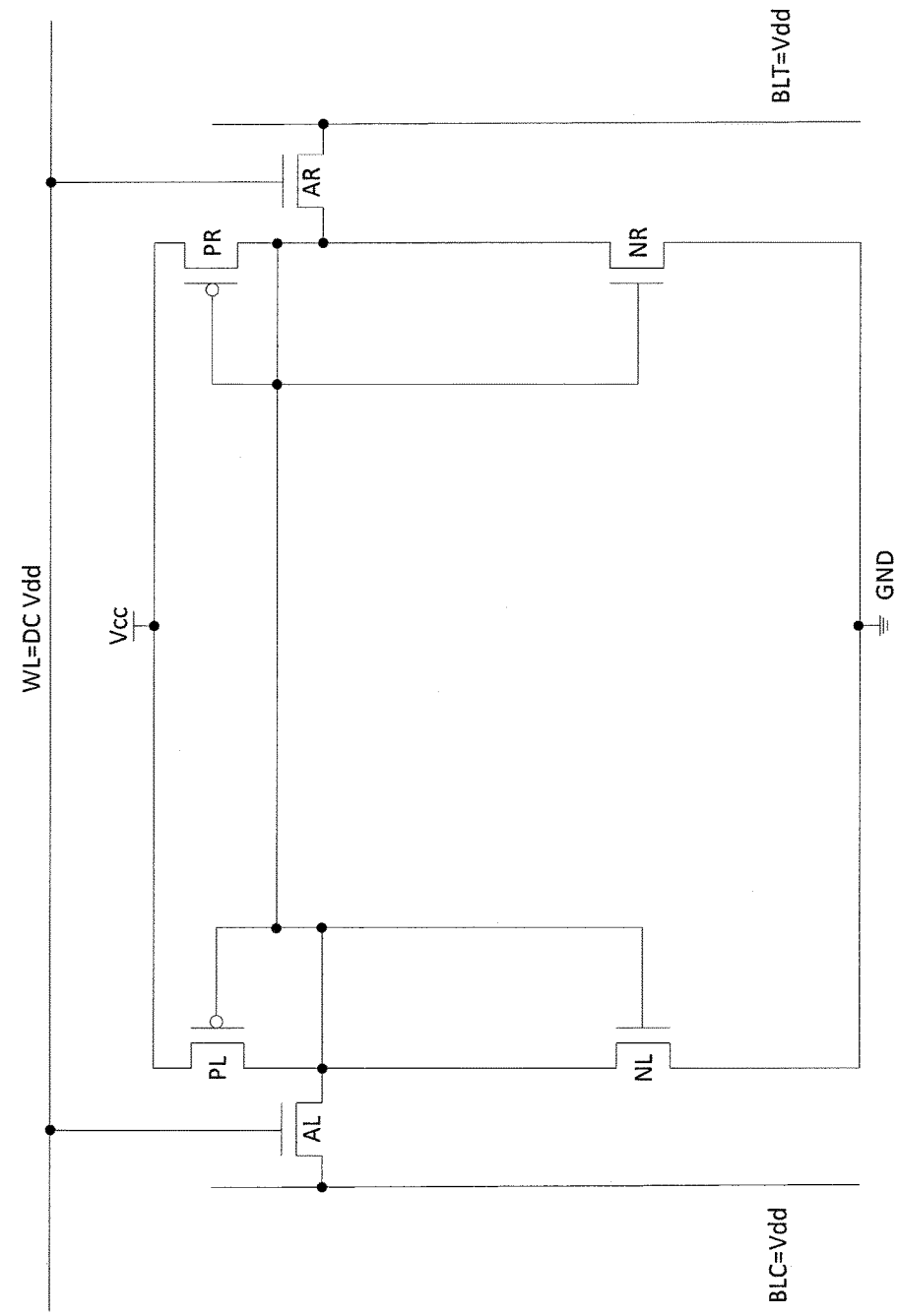
FIG. 1 is a schematic diagram illustrating an exemplary device that may be modeled and evaluated in accordance with the present disclosure, e.g., a six-transistor static random access memory cell.

The present disclosure generally relates to statistical-simulation-based evaluation of various systems, including integrated circuit (IC) designs, agricultural systems, physical systems, and so forth. For example, the methods of the present disclosure may be used for various purposes including integrated circuit (IC) yield prediction, IC or physical system failure analysis, agribusiness prediction, infectious disease prediction, financial modeling, risk assessment, and so forth. Throughout the present disclosure, examples are primarily described in connection with IC design evaluation. Additional examples are described in connection with other systems. However, those skilled in the art will appreciate that various examples described are equally applicable to systems of a different nature.

With respect to IC design evaluation, embodiments of the present disclosure increase the speed of yield analysis over existing techniques through the creation of a macro-model via machine learning and the utilization of the model for outcome predictions using techniques such as mixture importance sampling (MIS), Bayesian statistical methodologies, and the like. To illustrate, in one embodiment the present disclosure starts with at least a portion of a device design and sweeps variables randomly to generate different permutations, or samples. These variables may include physical parameters and/or operating parameters of the device. For example, for a static random access memory (SRAM) cell, there are typically six transistors, each with a threshold voltage (Vt). Each of these threshold voltages may comprise a physical parameter characterizing the SRAM cell. Other device parameters may include the length (L) and width (W) of each of the transistors, a dopant concentration in gate silicon, and so forth. As an example of an operating parameter, there is a supply voltage (Vdd) that will be used in operating the device that includes the SRAM cell. Another operating parameter may comprise the ambient temperature. With respect to an analog circuit or a mixed digital/analog circuit, an operating parameter may comprise the frequency of a received signal or an input signal, and so forth. In one embodiment, exploratory samples are obtained via uniform sampling, Latin hypercube sampling, or similar sampling technique. Henceforth, throughout the present disclosure the term device parameter may be used to refer to both physical parameters of a device and operating parameters of a device.

In any case, simulations are run with different combinations of variable values with the intention to see failures, e.g., where the device will not be able to read, not be able to write, not be able to store data, etc. In one example, the simulations are run using SPICE or a similar simulation program. After running many simulations, failure regions in a multi-dimensional/n-dimensional space may materialize at different variable values or different combinations of variable values. For example, failures may occur in the simulations at supply voltages above and below certain values, certain ranges of voltage and temperature combinations, certain length-to-width ratios of transistors, and so forth.

Thereafter, a regression analysis is conducted to fit the data to a multiple order polynomial model/equation (also referred to herein as a macro-model) characterizing the performance of the integrated circuit. In one example, sensitivity analysis is conducted to assist in determining which parameter(s)/variable(s) have the worst impact on a performance parameter of the device. In particular, sensitivity analysis may be used to determine the sensitivity of different variables to determine which have the largest impact upon the performance parameter. Accordingly, in one example the list of important variables is shortened. For example, the top X variables only may be selected for use in the macro-model. It should be noted that as used herein, a performance parameter comprises a failure criterion with respect to the device design. For example, the inability to write or store data to an SRAM cell may be considered to be a performance parameter. Thus, if a simulation indicates that the SRAM cell will successfully write and/or store data, the value of the performance parameter may have a value of '1', e.g., success. On the other hand, if the simulation indicates that the SRAM cell characterized by the particular combination of variables is incapable of storing data, the performance parameter may have a value of '0', e.g., failure.

Other types of performance parameters include read stability, whether the device is able to maintain a stored data value during a read operation, read delay time, write delay time, margins associated with read and write times, and so forth. With respect to some performance parameters, a threshold value may be defined above or below which the outcome is considered successful or unsuccessful. For example, read delay time requires a definition of a failure/success threshold, since delay time may fall along a continuous scale. In addition, it should be noted that examples of the present disclosure are not limited to any particular numbering convention and that the use of '1' and '0', as described herein, is for illustrative purposes only.

Once constructed, the macro-model/equation represents the center of gravity of the failure. In one example, the model is fitted to the boundary contour of the failure region, e.g., to the closest point(s) of the failure region to the normal mean of the device parameters/variables. In another example, the macro-model is fitted to estimated points extrapolated from location(s) of boundary points of the failure region of interest. Once the macro-model is created, sampling may continue with the assistance of the macro-model. In particular, in one example the sampling distribution is shifted into the failure region(s) represented by the macro-model. For instance, new samples may be obtained from a feature space of device parameter and/or operating parameter variables using importance sampling (IS) techniques, e.g., MIS. However, instead of continuing to run simulations in SPICE or in another simulator to determine success/failure outcomes, the macro-model, i.e., the multiple-order polynomial equation, is modified and solved using the combinations of variables selected from the shifted sampling distribution in order to determine the success/failure outcomes for each of the particular different combinations of variables.

Notably, embodiments of the present disclosure offer significant speed improvements in accurate yield analysis as compared to existing techniques. For instance, embodiments of the present disclosure are demonstrated to be at least 30 to 100 times faster than existing state-of-the-art techniques utilizing MIS and/or MIS in combination with table lookup (TLU) methodology, thereby allowing device parameter variations of 5σ and beyond to be explored in substantially less time.

To aid in understanding the present disclosure, FIG. 1 illustrates an exemplary memory cell (e.g., a static random-access memory (SRAM) cell) design that can be modeled and subject to analysis in accordance with the present disclosure. Transistors PL, NL, PR and NR form a cross-coupled static latch that provides the storage of a value in the cell. Transistors AL and AR provide for access to the value in response to a wordline select signal WL. Bitlines BLT (true bitline) and BLC (complement bitline) couple all cells in a column (not shown), so that when a row is selected by signal WL, only one row cell from each column is exposed to the memory logic. For a write operation, bitlines BLC and BLT are charged to voltages corresponding to the desired state of the memory cell and WL is activated (pulsed), setting the state of the latch formed by transistors PL, NL, PR and NR. For a read operation, the bitlines BLC and BLT are previously charged to opposite state predetermined voltages (generally Vdd and ground (GND)), and to commence the read, WL is pulsed and a sense amplifier coupled to bitlines BLC and BLT determines the stored state by differential comparison of bitlines BLC and BLT. Depending on the relative strengths of the transistors PL, PR, NL, NR, AL and AR, the cell will exhibit varying ability to perform to predetermined read/write cycle times and may be unstable in that the cell value does not remain constant after a write or when being read. In addition, as operating frequencies are increased and device sizes correspondingly decreased, the variations take on a statistically significantly greater range causing failure of an increasing number of devices in a lot.

While the illustrated SRAM cell is an example of a cell of order 4 that may be analyzed and improved by a method according to an embodiment of the disclosure, it should be understood that the techniques illustrated herein may be applied to memory cells of any order and design and to circuits other than memory circuits, as well. (Order as used herein refers to the number of devices that implement the storage element of the cell exclusive of the bitline access transistors).

Figure 2:
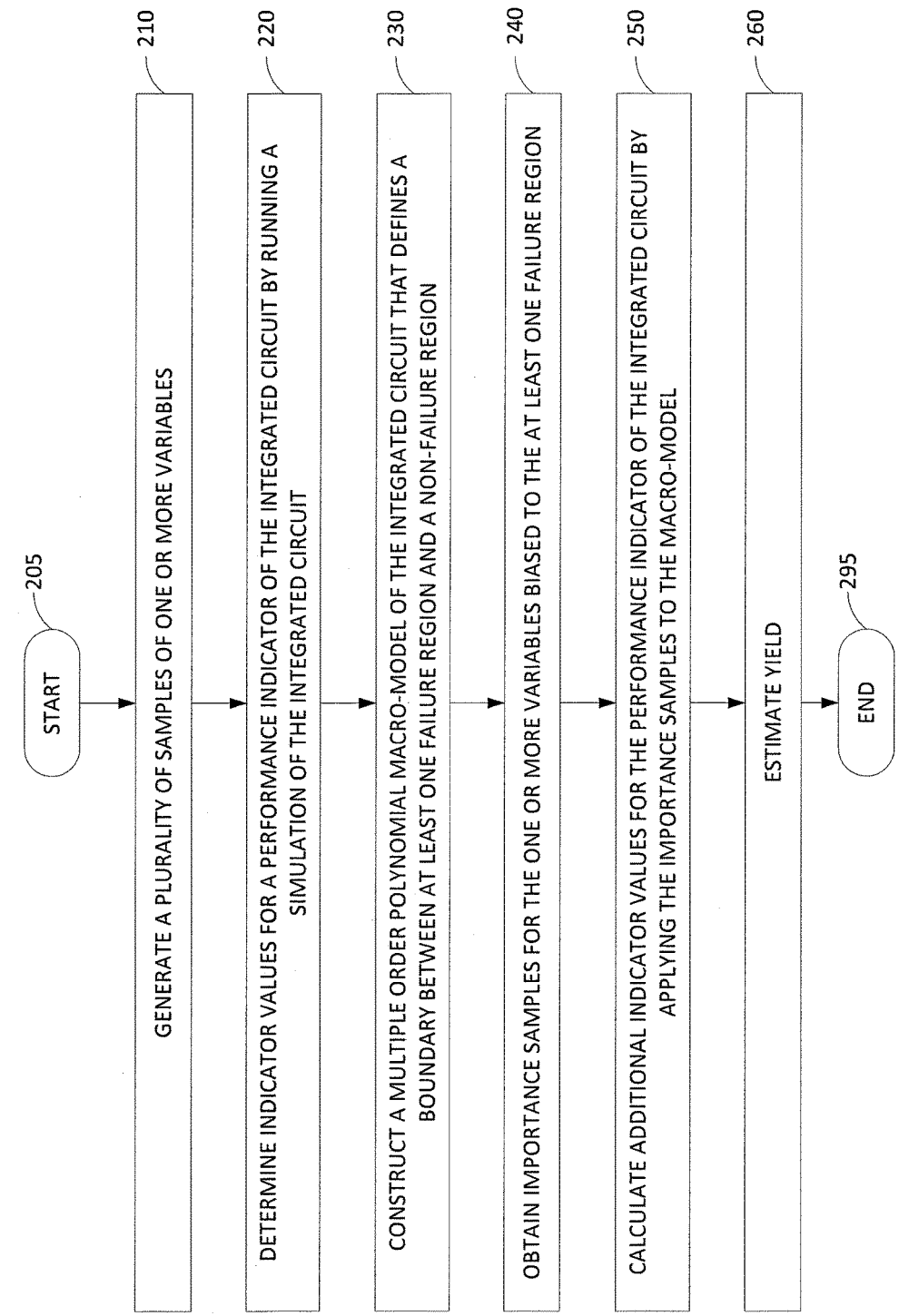
FIG. 2 is a flow diagram illustrating one embodiment of a method for statistical simulation-based evaluation of a system, according to the present disclosure.

To further aid in understanding the present disclosure, FIG. 2 illustrates a flow diagram illustrating one embodiment of a method 200 for evaluating a system, e.g., a design of an integrated circuit, according to the present invention. In one embodiment, the steps, functions, or operations of method 200 may be performed by a computing device or system 800, and/or processor 802 as described in connection with FIG. 8 below. For illustrative purposes, the method 200 is described in further detail below in connection with an example performed by a processor, such as processor 802.

The method 200 begins at step 205 and proceeds to step 210.

In step 210, the processor generates a plurality of samples of one or more variables. For example, each of the plurality of samples of the one or more variables may be selected from a range of potential values for at least one device parameter of the integrated circuit. In one example, the method 200 begins with a simulator model of the integrated circuit/device. For example, a SPICE model, a Berkeley Short-channel Insulated-gate field effect transistor (IGFET) Model (BSIM) model, a Technology Computer Aided Design (TCAD) model and so forth may be utilized. Henceforth, examples of the present disclosure will be described in connection with the use of a SPICE model. In one example, only a portion of the device may be evaluated through the process of the method 200. For instance, for a device consisting of hundreds of thousands of transistors, a cross-section of anywhere from 50 to 1000 transistors may be analyzed. However, for ease of illustration, the method 200 will be described in connection with an example where the device under evaluation comprises the SRAM cell of FIG. 1 (with only six transistors).

In this regard, the physical parameters of a device may include such things as a respective threshold voltage (Vt) for each of the transistors, transistor length, transistor width, or the length-to-width ratio of each of the transistors, a dopant concentration in gate silicon, line widths and/or aspect ratios of one or more connecting lines within the device, component spacing(s), and so forth. Similarly, the operating parameters may comprise a supply voltage (Vdd), an ambient temperature, and so forth. In another example, e.g., with respect to an analog circuit or a mixed digital/analog circuit, an operating parameter may comprise the frequency of a received signal or an input signal, and so forth. Notably, each of the transistors may have up to ten or more different variables. Therefore, in a cross-section of 1000 transistors, there may be 10,000 or more variables that may affect the outcome. For illustrative purposes, device parameters/variables will be referred to herein as $x_1, x_2, x_3, \ldots, x_n$.

In one example, step 210 comprises obtaining samples via a Monte Carlo technique of uniform sampling, Latin hypercube sampling, or similar sampling technique. In general, variables are swept randomly in order to generate different sets of device parameter values with the intention to see failures in the simulated device, e.g., where the device will not be able to read, not be able to write, not be able to store data, etc.

At step 220, the processor determines indicator values for a performance indicator of the integrated circuit by conducting multiple runs of a simulation of the integrated circuit to generate the indicator values. In accordance with the present disclosure a performance indicator may comprise a success or failure criterion for the device under analysis. For example, with respect to the SRAM cell of FIG. 1, a performance indicator may comprise "writeability", with indicator values comprising either a '1', e.g., pass/success, or '0', e.g., fail.

In one example, for each run of the simulation, the device simulator (e.g., the SPICE model) is modified to account for the particular variable values contained in a particular sample of the plurality of samples. Thus, in one example, the output of each run of the simulation is an indicator value of the performance indicator/failure criterion, and may take a value of '1', e.g., success, or '0', e.g., failure. As an example, the supply voltage may be swept across different voltages, e.g., from zero up to voltages in excess of a normal intended supply voltage. When samples include supply voltage values that are very low, e.g., 0.3 volts or less, simulation runs are likely to generate many failures. Similarly, if the operating temperature is increased from 15-26 degrees centigrade to 70 degrees centigrade, for example, the number of failures will increase. In any case, after running many simulations, at least one failure region at different variable values or different combinations of variable values will become apparent and materialize. For example, it may become apparent that supply voltages above and below certain values, certain ranges of voltage and temperature combinations, certain length-to-width ratios of transistors and so forth, may cause failures in the device simulation with respect to a performance indicator. In one example, the number of samples and the number of simulation runs of step 220 is selected by a user/operator. In another example, the number of samples and the number of simulation runs is constrained by a user-defined maximum runtime.

Figure 3:
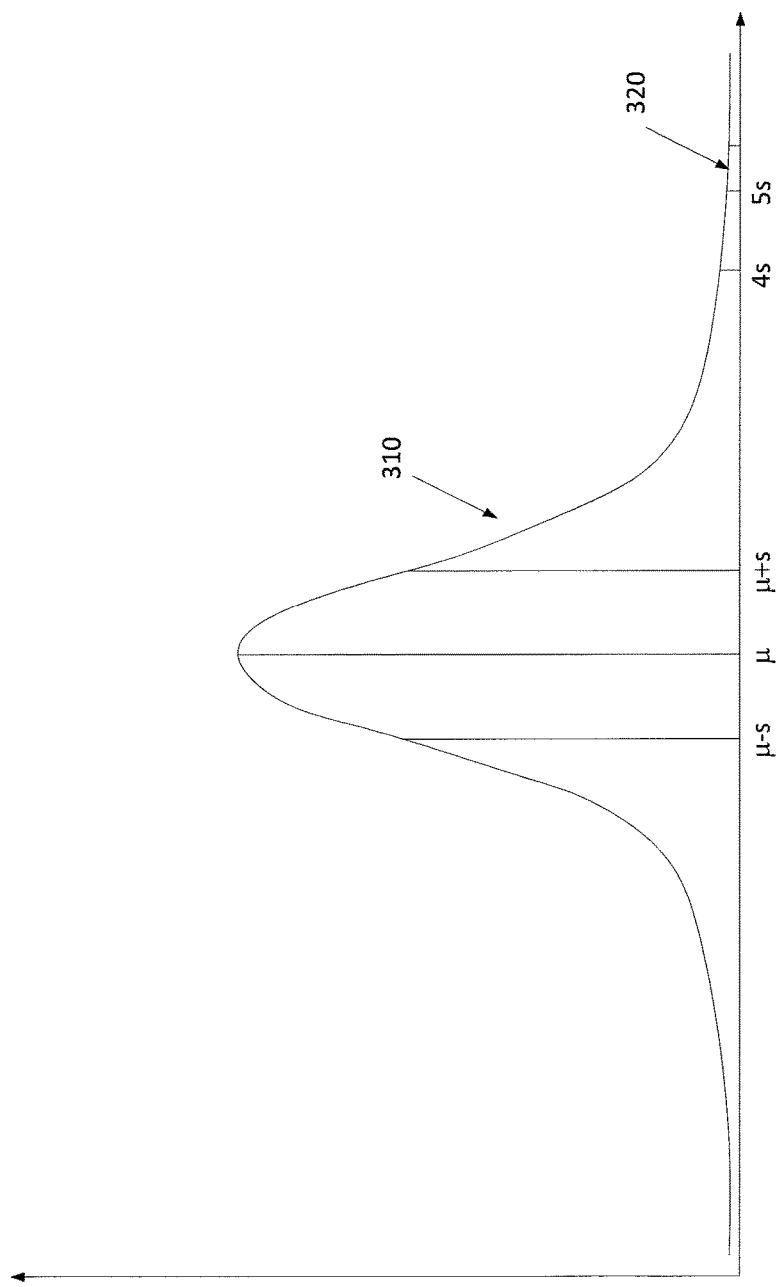
FIG. 3 is a graph illustrating a probability density function, according to the present disclosure.

To aid in understanding aspects of the method 200, FIG. 3 comprises a graph 300 illustrating a probability density function 310. In one example, the probability density function 310 is for one or more performance indicators with respect to a variable value. For example, the horizontal axis may represent variable values of a particular variable, while the vertical axis may represent a probability of a successful/non-successful simulation run. In one example, the vertical axis may correspond to the success/failure for a single performance indicator, e.g., writeability, read stability, etc. In another example, the vertical axis may represent a composite success/failure criterion for yield analysis. For instance, a failure for any one criterion may be considered to be a failure for that value for yield analysis purposes. The distribution 310 generally following a Gaussian shape and extends past 5 standard deviations (which may be referred to herein as 5s, 5 sigma or 5σ) on either side of a mean value.

In the present example, failure region 320 in the graph 300 is located past the 5σ point and is shown as a shaded area. The yield of the cell modeled by distribution 310 can be predicted from the graph 300, and thus the yield of the overall device. However, the accuracy near failure region 320 is limited due to the relatively sparse distribution of samples in the tails of distribution 310. Although only a two dimensional graph 300 is shown (a univariate normal distribution), other examples may consider a probability density function that comprises a multivariate normal distribution with multiple dimensions to account for a large number of variables.

Returning to a discussion of the method 200 of FIG. 2, in one example, the input parameter values for each sample are generated by a similar Gaussian distribution around a nominal vector of cell parameter values by a Monte-Carlo algorithm, e.g., uniform sampling, at step 210. Thus, graph 300 may alternatively illustrate a probability density function 310 modeling the likelihood that a particular value for a variable will be selected. In other words, the horizontal axis may represent possible values for a variable, while the vertical axis represents the likelihood that the particular value will be selected. Values near the mean (μ), are therefore more likely to be selected than values near the 5σ point. Again, it should be noted that only a univariate normal distribution is shown (i.e., with respect to a single variable), but that other examples may consider a probability density function that comprises a multivariate normal distribution with multiple dimensions to account for a large number of variables, where the mean (μ) is a nominal vector representing a mean combination of variable values.

At step 230, the processor constructs a macro-model of the integrated circuit that defines a boundary between at least one failure region and a non-failure region. In one example, the macro-model comprises a multiple-order polynomial equation. In one example, the model is fitted to the boundary contour of the at least one failure region, e.g., to the closest point(s) of the failure region to the normal mean of the device parameter and/or operating parameter variables. In another example, the macro-model is fitted to estimated points extrapolated from location(s) of boundary points of the failure region(s) of interest. For example, the macro-model may reside within an n-dimensional vector space where each dimension relates to a particular variable of interest. A "normal" vector in the n-dimensional space may represent the mean of the intended/normal device parameters/operating parameters of the device design. In addition, each sample set of variables may similarly be represented as a "sample" vector within such n-dimensional space. Moreover, each sample vector may be associated with an indicator value for a performance parameter based upon a simulation run at step 220. Thus, one or more "failure regions" may manifest within the n-dimensional space where sample vectors having "failure" indicator values are clustered. Conversely, non-failure regions are regions in the space where vectors are associated with pass/success indicator values. In other words, the different indicator values define the failure regions and the non-failure regions respectively.

Figure 4:
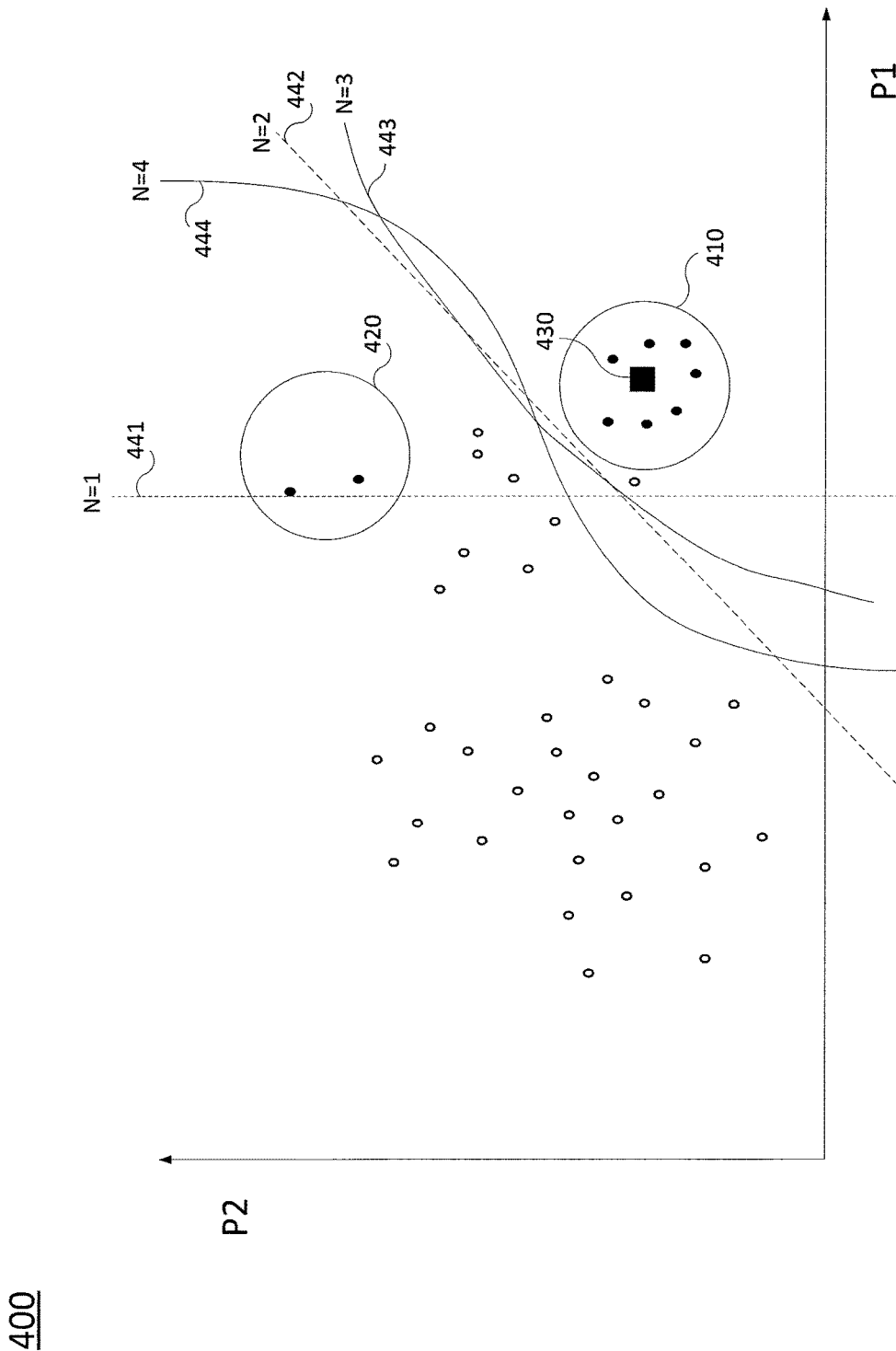
FIG. 4 illustrates an example feature space, according the present disclosure.

To aid in understanding the process of step 230, FIG. 4 illustrates an example feature space 400. The illustration is two-dimensional, e.g., with respect to a first parameter (P1) and a second parameter (P2), but in actual practice, a larger number of dimensions (e.g., in an n-dimensional space) are being evaluated simultaneously. A number of sample points are generated by uniformly sampling the variable parameter space with respect to the device parameters and/or operating parameters, corresponding to the dots shown in the Figure. Quasi-random sampling techniques can be used to improve the spread of the samples across the parameter space. Since memory cell failure regions generally will extend to the bounds of the analysis range (with respect to the parameter deviation) from the point at which the failures occur, failure regions can be ascribed to failure region boundaries beyond which the probability of failure only increases.

As shown in FIG. 4, hollow dots depict non-failing points and solid dots depict failing points. After a threshold number of failures is accumulated, which may be qualified by observing their proximity in the parameter space if multiple failure regions might be present (in order to group the failures), a particular failure region of interest 410 may therefore be identified. In one embodiment, a vector centroid 430, or "center of gravity" of the failure region 410 may be computed from the vector distances of the points as the vector of average distance in each parameter space. It should be noted that there may be multiple failure regions for some embodiments of the present disclosure, including other failure regions, such as failure region 420. Thus, in one example, those regions can be ignored if not of interest, or may be further evaluated.

For instance, returning to a discussion of the method 200 of FIG. 2, step 230 may be repeated with respect to each failure region. For example, in one embodiment the method 200 may comprise generating a separate macro-model for each failure region. In another embodiment, the macro-model may be fitted to multiple failure regions. However, in this case the complexity of the macro-model (e.g., the polynomial order and/or number of retained variables) may need to be increased in order to retain sufficient accuracy.

In one example, step 230 comprises a regression analysis to fit the multiple-order polynomial equation/model to the data. In one example, the order of the polynomial may be user-selected, or may be constrained by a user-defined maximum runtime. For instance, the user may specify that the construction of a regression model at step 230, or the total time for all of steps 205-230 not exceed a particular duration. In one example, the macro-model may take the form of the following equation:

$$I(x_i) = a_0(x_0)^2 + a_1(x_1)^2 + a_2(x_2)^2 + b_0(x_0) + b_1(x_1) + b_2(x_2) + c + d_0(x_0 \cdot x_1) + d_1(x_0 \cdot x_2) + d_2(x_1 \cdot x_2)$$ Equation 1

Notably, for ease of illustration this simplified example comprises only a second-order polynomial with three variables, $x_0$, $x_1$ and $x_2$. However, in an application regarding a typical sub-nanometer SRAM memory array, it is anticipated that the polynomial order will be of higher degree and the number of variables will be significantly greater, e.g., 1000 or more.

It should be noted that the present disclosure is not limited to any particular regression technique. For example, at step 230 the method 200 may implement techniques of linear regression, multiple regression, Poisson regression, logistic regression, polynomial regression and the like, and may further include least squares estimation, Bayesian methods, principal component analysis (PCA), and other processes for enhancing the regression technique(s) used at step 230. However, in one embodiment a sparse regression methodology is implemented, since sparse regression is particularly useful in dealing with large numbers of variables. In particular, sparse regression allows the pruning of non-important and/or less-important variables while keeping the most important variables affecting a performance parameter. In this regard, step 230 may further include sensitivity analysis to assists in determining which parameter(s)/variable(s) have the worst impact. In other words, in the present example of silicon failure analysis, the sensitivity analysis determines the sensitivity of the performance parameter to different variables to determine which have the largest impact upon the failure rate of the device. In this way, the list of important variables may be shortened. For example, the top 'N' variables only may be selected for use in the regression model. In one example, 'N' is a user-selectable value. In another example, 'N' is set based upon a user-selected time constraint, or in consideration of a desired accuracy as indicated by a user/operator. The result of such pruning is that one or more polynomial terms are dropped from the macro-model/equation. As an alternative conceptualization, the number of dimensions in the n-dimensional space is reduced to 'N' dimensions.

Referring again to the example of FIG. 4 the macro-model/multiple-order polynomial equation may be graphically represented by one of the curves 441-443 illustrated in the graph 400. In particular, regions 410 and 420 illustrate failures. From various models based on P1 and P2 variables, failure boundaries can therefore be identified for 1 dimensional models (N=1), 2 dimensional models (N=2), and so on for higher order models. Thus, curves 441-443 correspond to failure boundaries as represented by models of different dimensionalities. As seen in the graph 400, the failure region boundary shows a diminishing return in accuracy and complexity as the number N increases. Thus unimportant terms which do not significantly contribute to accuracy improvement or complexity reduction can be dropped from the macro-model.

At step 240, the processor obtains importance samples for the one or more variables biased to the at least one failure region. For example, step 240 may comprise a mixture importance sampling (MIS) process where the probability distribution function of variable samples is shifted such that the mean is centered in the failure region(s).

Figure 5:
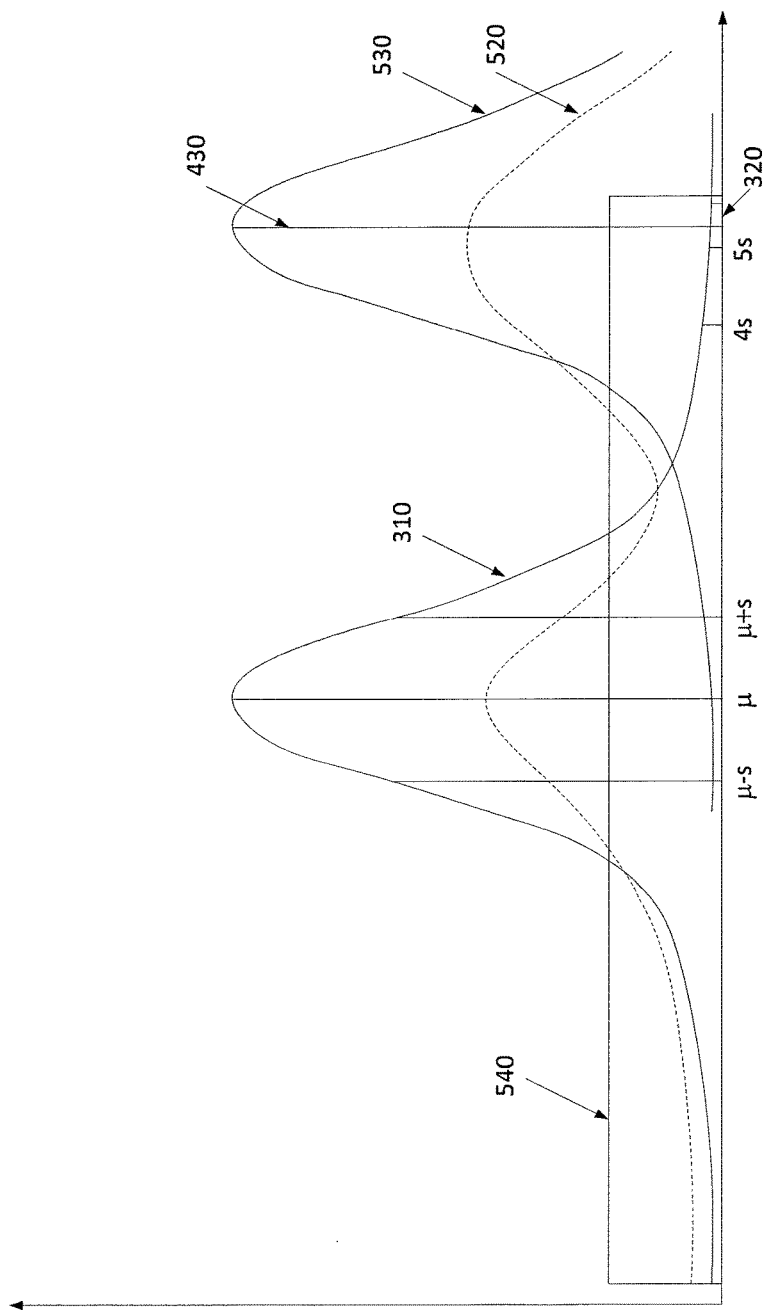
FIG. 5 is an additional graph illustrating several probability density functions, according to the present disclosure.

In this regard, FIG. 5 comprises a graph 500 illustrating several probability density functions, according to the present disclosure. Notably, the horizontal axis of graph 500 may relate to the same variable or variables as graph 300 of FIG. 3. However, instead of using the sampling probability distribution 310 centered at the normal mean (μ), a modified sampling probability distribution may be utilized. In particular, once at least one failure region of interest is identified in the parameter space (e.g., in a space such as illustrated in FIG. 4), in one example a mixture 520 of distributions 310, 530 and 540 may be employed to improve the density of samples in the failure region 320, while ensuring that gaps are not left in the distribution that might otherwise miss other failures. The mixture sampling function distribution 520 can be expressed by:

$$g_\lambda(x) = \lambda_1 p(x) + \lambda_2 U(x) + (1 - \lambda_1 - \lambda_2) p(x - \mu_s)$$ Equation 2 where $\lambda_1$ and $\lambda_2$ are coefficients used to control the mixture, which can be determined by the position of a new sampling function center $\mu_s$ 430 that is used to improve the concentration of samples around $\mu_s$. Note that $\mu_s$ is not the center of mixture sampling function distribution 520, but rather the center of Gaussian distribution 530 forming part of sampling function distribution 520. In one example, uniform distribution U(x) 540 is also included in the mixture, which helps ensure that some samples are present for all values within the interval over which uniform distribution 540 extends. The choice of coefficients, in combination with the inclusion of the uniform distribution is made so that the number of samples in the region of interest is increased, but no "dead spots" are present in the analysis. The result of the mixture sampling function is to generate a relatively larger number of samples over region 320 (as compared to the distribution of FIG. 3), yielding a much more precise estimate of the impact of region 320 on failure. It should be noted that due to the tunability of parameters $\lambda_1$ and $\lambda_2$, in some embodiments the uniform distribution may 540 may not contribute to the probability distribution curve 520, e.g., where $\lambda_2$ is zero. In addition, in alternative embodiments, sampling function distribution 530 alone may be utilized at step 240.

In step 250, the processor calculates additional indicator values for the performance indicator of the integrated circuit by applying the importance samples generated at step 240 to the macro-model of the integrated circuit. For instance, Equation 1 may be solved using variable values ($x_0$, $x_1$, $x_2$, . . . , $x_n$) of a sample generated at step 240. In one embodiment, for each sample generated at step 240, the result of step 250 may simply comprise an indicator value indicating a success '1' or failure '0'. Notably, since step 250 does not involve additional runs of a SPICE model, step 250 is significantly faster than the operations of step 220.

At step 260, the processor estimates a yield based upon the data gathered via steps 205-250. Notably, selecting samples by MIS skews the samples such that less likely samples become commonplace. As such, the yield analysis may correct for the fact that the samples from step 240 actually comprise outliers for the variable values. For example, assuming the following: f(x) is an original distribution function characterizing the probability of a sample in an original environment (e.g., curve 310 of FIGS. 3 and 5); g(x) is a shifted Gaussian sample distribution function characterizing the probability of the sample per MIS, e.g., given by Equation 2 above and illustrated by curve 520 or curve 530 in FIG. 5; $W_i$=f(x)/g(x) is a weighted function; and I($x_i$) is the macro-model given by Equation 1 above. Then the corrected probability $P_f$ may be given by:

$$P_f = W_i \cdot I(x_i) \qquad \text{Equation 3}$$

Thus, yield analysis may estimate failure probabilities based upon the original likelihood of certain variable values as per f(x), e.g., normal distribution 310.

Following step 260, the method 200 proceeds to step 295 where the method ends.

It should also be noted that the foregoing method 200 and the examples contained therein are provided for illustrative purposes only. Thus, in other, further and different embodiments, various steps of the method 200 may be modified, or include additional or different operations. For instance, if the boundaries of one or more failure regions are not well defined after step 220, then steps 210 and 220 can be repeated with a larger set of initial random vectors. In another example, several steps of the method 200 may comprise the same or substantially similar operations to those described in commonly owned U.S. Pat. No. 7,380, 225, issued May 27, 2008, the entirely of which is incorporated herein by reference. For instance, steps 210, 220 and 240 may be implemented in accordance with the disclosure of U.S. Pat. No. 7,380,225. Similarly, either or both of steps 220 and 250 may be supplemented with or replaced by a look-up table (LUT) based technique for determining an indicator value of a performance indicator, e.g., in accordance with commonly owned U.S. patent application Ser. No. 13/107,355 filed on May 31, 2011, the entirety of which is incorporated herein by reference. For example, the present disclosure may utilize a lookup table to estimate an indicator value of the performance indicator for a given value of a device parameter from a first value in a lookup table that is nearest to the given value, or by interpolating an indicator value based upon results of previous simulation runs.

Figure 6:
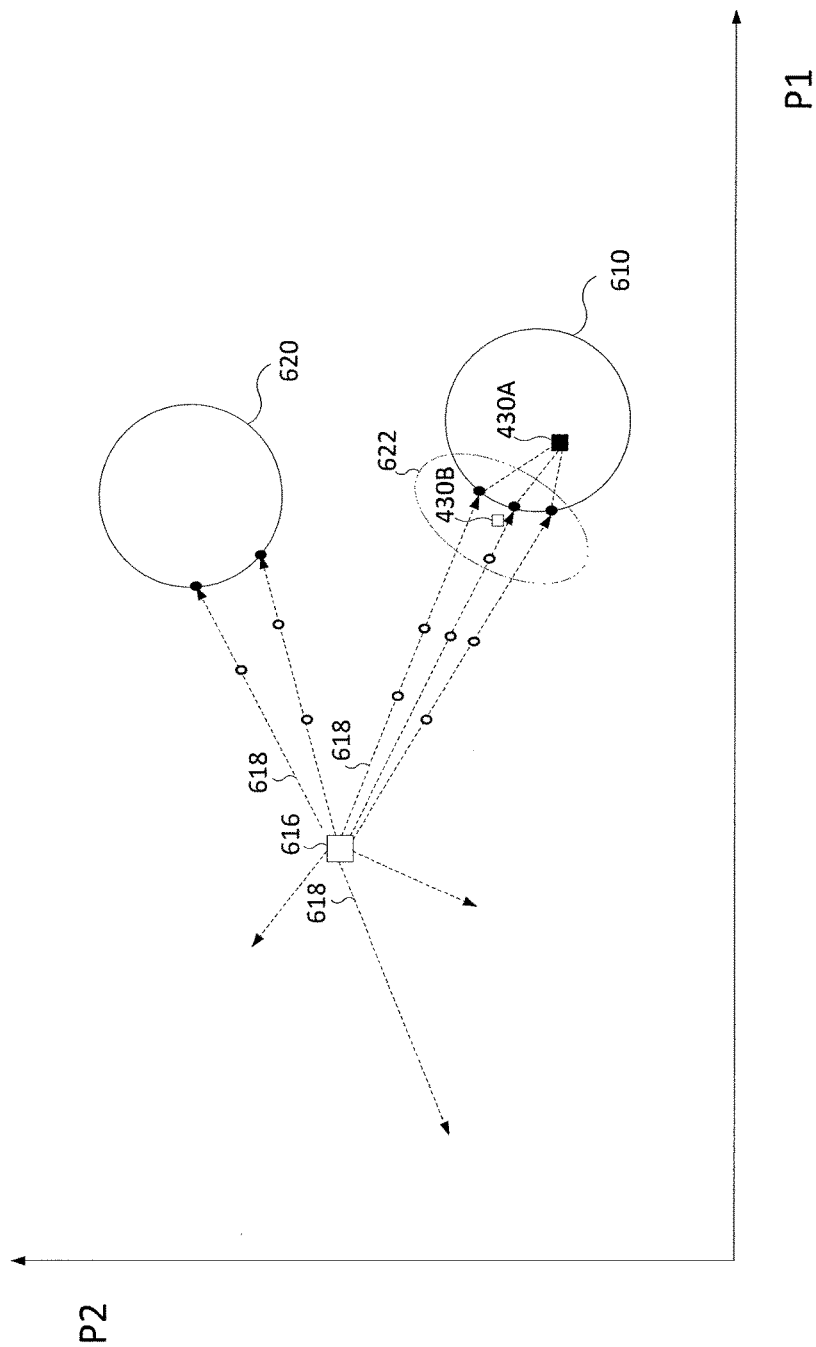
FIG. 6 illustrates an additional example feature space, according to the present disclosure.

In still another example, step 210 may alternatively comprise sampling by starting with a vector of nominal memory cell parameter values and then (randomly) generating a sufficient initial number of vector directions along which failure analysis proceeds until failure points are detected. In this regard, FIG. 6 illustrates another example feature space 600 for demonstrating this alternative technique for locating sampling function centers for a device design having multiple dominant failure regions. The technique may also be used for single failure region analysis, as well. Although only two dimensions P1 and P2 are illustrated with respect to a first parameter and a second parameter, in actual practice, a larger number of dimensions (e.g., in an n-dimensional space) will be evaluated simultaneously. A vector of nominal memory cell parameter values 616 is used as a starting point for random generation of a sufficient initial number of vector directions 618 along which failure analysis proceeds until failure points are detected. A sufficient number of vectors are generated so that failure regions will not be missed by the analysis. Gaussian Latin hypercube sampling can be used to ensure uniform placement of the vectors in all directions.

The analysis then proceeds away from nominal vector 616 as illustrated. The generally monotonic behavior of a circuit as the parameters vary in one direction away from the nominal ensures that failing points will only be encountered at and beyond the boundaries of the failure regions 610, 620. The new sampling function center ($\mu_s$) for subsequent MIS analysis is determined either by the mean vector 430B corresponding to the group of boundary points 622, or an estimated vector 430A is extrapolated within failure region of interest 610 from the location of the boundary points. After a first iteration, if the boundaries of failure regions 610, 620 are not sufficiently defined, a local set of random vectors is generated to enhance the set of samples around the boundaries. After boundaries 610, 620 are sufficiently defined, ($\mu_s$) is chosen as described above.

Furthermore, as mentioned above, embodiments of the present disclosure are not limited to integrated (IC) yield prediction and/or failure analysis. Rather, the methods of the present disclosure provide a broad range of useful applications in such fields as IC yield prediction, IC or physical system failure analysis, agribusiness prediction, e.g., for crop yield, livestock health and survivability, herd productivity, etc., infectious disease prediction, financial modeling, risk assessment, and so forth. Thus, those skilled in the art will appreciate that the method 200 may be modified to evaluate these and other systems. In addition, the examples of FIGS. 3-6 may represent probability density functions and feature spaces with respect to system parameters/variables, performance indicators and performance variables associated with such diverse systems.

For instance, a disease prediction system may model the chance of being infected by a particular disease, and may thus be used for disease rate prediction. Accordingly, embodiments of the present disclosure may learn and build a macro-model based on a set of measurements and observations from a large number of individuals in a population that contains infected and non-infected people. For example, each person in the population may contribute a number of measured quantities (features) and an indicator value of infected, '1', and non-infected, '0'. In this case, system parameters or variables may include measured/observed values for features such as temperature, body mass, height, weight, quantities from recent blood test, marital statuses, number of children, hereditary quantities, and so forth. Likewise, the performance indicator may be a criterion of whether or not a person is infected, with associated indicator values of infected, '1', or not, '0'. In this regard, the distributions in FIGS. 3 and 5 may represent the probability that a value for one of the system parameters of temperature, body mass, height, weight, etc., centered around a mean value (e.g., FIG. 3) or a shifted mean value (e.g., FIG. 5, per MIS) is randomly selected. Similarly, the graphs of FIGS. 4 and 6 may represent n-dimensional spaces where each dimension represents one of the variables/system parameters of temperature, body mass, height, weight, etc. Thus, the points in the graphs of FIGS. 4 and 6 may illustrate sample vectors, where each vector is associated with a set of sample values for each of 'n' variables. In this example, failure regions may comprise clusters where a large number of "failures", e.g., infected persons, are predicted.

Figure 7:
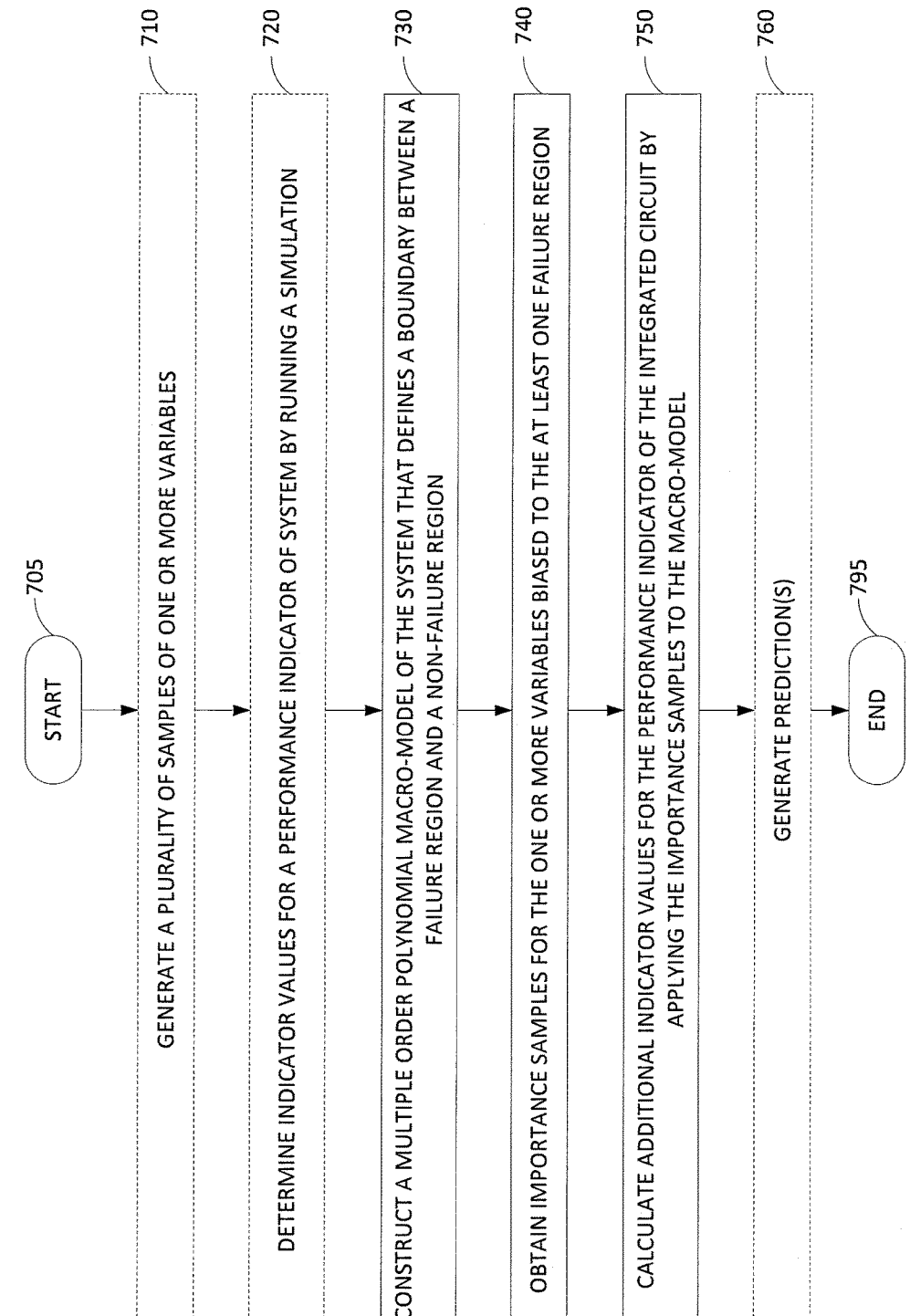
FIG. 7 is a flow diagram illustrating another embodiment of a method for statistical simulation-based evaluation of a system, according to the present disclosure.

To further characterize these various embodiments, FIG. 7 illustrates an additional method 700 for evaluating a system according to the present disclosure. Notably, the steps, functions and/or operations of the method 200 may be considered to be a subset of the method 700, e.g., a more specific implementation of the method 700 with respect to IC yield prediction/failure analysis. In one embodiment, the steps, functions, or operations of method 700 may be performed by a computing device or system 800, and/or processor 802 as described in connection with FIG. 8 below. For illustrative purposes, the method 700 is described in further detail below in connection with an example performed by a processor, such as processor 802.

The method 700 begins in the step 705 and proceeds to optional step 710 where the processor generates samples of one or more variables. Notably, step 710 may comprises the same or substantially similar functions to those described above in connection with step 210 of the method 200. For example, each variable or system parameter may have a range of possible values having a probability of occurrence that follows a Gaussian curve centered on some mean value. For example, with respect to an infectious disease prediction system, given a randomly selected person, the probability/likelihood that his or her height will have a particular value may be represented by a Gaussian curve, such as illustrated in FIG. 3. The same may be true for each of a number of other system parameters, including the age of the person and so forth. Some parameters may take a range of values that do not strictly follow a Gaussian distribution, e.g., gender, smoker/non-smoker, and so forth. However, such values may still be randomly selected at step 710, e.g., according to the likelihood of the value. For example, for the parameter of 'gender', the likelihood of sample being 'male' or 'female' is close to 50 percent. In one example, the samples may be taken from "real" sample sets pertaining to actual persons.

With respect to a risk analysis system, e.g., for predicting hurricane risk/loss, the variables may pertain to such parameters for a property as distance from the ocean, number of floors, elevation, year built, and so forth. Still another system may relate to financial prediction, where the parameters/variables may relate to a portfolio's stock/bond ratio, a ratio of domestic to foreign holdings, a target retirement age, an account expense ratio, a duration of anticipated investment, a current macroeconomic interest rate, e.g., a current U.S. Treasury yield, a London Inter-Bank Offering Rate (LIBOR), and so forth.

At optional step 720, the processor determines indicator values for a performance indicator of the system by running a simulation. For example, step 720 may comprise the same or substantially similar functions to those described above in connection with step 220 of the method 200. In one embodiment, step 720 may comprise running a disease progression simulation, e.g., a software program that simulates the progression of a disease through a population of a given area, using the samples generated at step 710 as input variables. The output of each simulation run may comprise an indication as to whether an individual has become infected according to the software model. In another example, step 720 may comprise inputting variable values of the sample(s) from step 710 into a simulation program that predicts insurance losses (e.g., for homeowner's insurance), a simulation program that predicts financial portfolio growth, and so forth.

In one example, steps 710 and 720 comprise obtaining observed results, e.g., from real-world experiments, historical observations, etc. For example, a disease may currently be spreading through a population in a given area. Therefore, pre-existing data may be obtained that indicates for each of a number of individuals whether the individual has become infected or not infected. The random samples may therefore comprise sets of parameters representing characteristics of the individuals for which observed data is available. With respect to a risk assessment system, steps 710-720 may comprise obtaining historical loss information for a large number of properties in a given area.

At step 730 the processor constructs a macro-model of the system that defines a boundary between at least one failure region and a non-failure region. In one example, the macro-model comprises a multiple-order polynomial equation fitted to at least one failure region. For example, each sample set of variables may be represented as a "sample" vector within an n-dimensional space. Moreover, each sample vector may be associated with an indicator value for a performance parameter. Thus, one or more "failure regions" may manifest within the n-dimensional space where sample vectors having "failure" indicator values are clustered. In one example, the macro-model may take the form of Equation 1 set forth above. Notably, step 730 may comprise the same or substantially similar functions to those described above in connection with step 230 of the method 200.

With respect to a disease progression system, the failure regions may represent clusters of parameter(s), e.g., temperature, age, height, gender, etc., for which individuals exhibit a high degree of infection. With respect to a financial modeling system, the failure regions may represent mixtures of portfolio conditions and external conditions, such as interest rates, etc., for which "unsuccessful" financial outcomes are likely. With respect to an agribusiness or agricultural system, failure regions may represent mixtures of conditions for which an unsuccessful crop yield is predicted. In this regard, it should be noted that for some systems, a failure/success criterion, or performance indicator, is not inherently associated with dichotomous indicator values. For instance, a final value a financial portfolio may take a range of values. Thus, in some instances, a failure/success criterion is defined by a user/operator. For example, an operator may define a failure criterion as a situation where the portfolio value does not support a replacement of at least 80 percent of pre-retirement income over an expected post-retirement lifetime. Similarly, a performance parameter with respect to crop yield may define a failure to be that where more than 50 percent of the crop does not survive to harvesting in a given growing season.

In one embodiment, the fitting of the macro-model to the as least one failure region includes a regression analysis. For example, step 730 may comprises a sparse regression process to prune the number of variables to include only the most important variables and to reduce the complexity of the multiple-order polynomial equation. In one example, a data matrix is created that includes features $(x_0, x_1, x_2, \ldots, x_n)$ and associated indicator values (y) e.g., infected, '1', or not-infected, '0'. In one example, a larger matrix is created that includes expanded features based on $(x_0, x_1, x_2, \ldots, x_n)$, e.g., $(x_0)^2$, $(x_1)^2$, $(x_2)^2$, $\log(x_0)$, $\log(x_1)$, $(x_0)^{-1}$, etc., as well as interactions between the features, e.g., $(x_0 \cdot x_1)$, $(x_0 \cdot x_2)$, $(x_1 \cdot x_2)$, etc. The sparse regression analysis then results in the selection of a set of features (columns) from the expanded data matrix to build a closed-form macro-model for predicting 'y'. As such, the macro-model can be used to predict whether an additional sample is infected. For example, if y=1 is defined as "infected" and if the predicted value of y, per the macro-model is 0.92, the sample may be declared to be likely infected (where greater than or equal to 0.90 may be an operator-defined threshold for declaring a sample to be likely infected).

At step 740, the processor obtains importance samples for the one or more variables biased to the at least one failure region. For example, step 740 may comprise a mixture importance sampling (MIS) process where the probability distribution function of variable samples is shifted such that the mean is centered in the failure region(s). Notably, as described above, steps 710-720 may comprise obtaining actual data/results based upon observed outcomes for real sample values. In other cases, steps 710 and 720 may comprise generating random samples using Monte Carlo techniques or the like, and plugging such samples into a simulator (e.g., a software program) that simulates the operation of the system at issue. However, in all cases, step 740 comprises obtaining processor-generated variable values for importance samples, where the selection of variables is biased to the one or more failure regions. In one example, step 740 utilizes a mixture sampling function distribution 520 of FIG. 5, expressed by Equation 2 set forth above.

At step 750, the processor calculates additional indicator values for the performance indicator of the system by applying the importance samples generated at step 740 to the macro-model of the system. For instance, Equation 1 may be solved using variable values $(x_0, x_1, x_2, \ldots, x_n)$ of a sample generated at step 740. In one embodiment, for each sample generated at step 740, the result of step 750 may simply comprise an indicator value indicating a success '0' or failure '1' (or vice versa, depending upon the particular implementation). In the example of modeling disease progression, step 750 may comprise predicting whether or not a particular individual having characteristics of the randomly generated sample will become infected by the disease.

Notably, since step 750 does not involve additional runs of a software simulation or collecting actual observed data, step 750 is significantly faster than the operations of optional step 720. In addition, the various types of systems that can be modeled by the present embodiments may exhibit very rare failure events. Accordingly, the selection of indicator values biased to the failure region(s) supports fairly accurate probability experiments for rare failure events, which are poorly handled by state-of-art Monte-Carlo approaches that do not use importance sampling.

Following step 750 the method 700 proceeds to optional step 760, or to step 795 where the method ends.

At optional step 760, the processor generates predictions from multiple passes of the operations of step 750. For example, step 760 may comprise estimating a crop yield, estimating a percentage of a population that will be infected by a disease, estimating an IC yield, and so forth. Alternatively, or in addition step 760 may comprise estimating outcomes for particular sets of parameters. For instance, an underwriter may evaluate whether or not to insure a new risk based upon a solution to the macro-model generated at step 750 using a number of input parameters provided by the potential insured party.

Notably, selecting samples by MIS skews the samples such that less likely samples become commonplace. As such, the predictions of step 760 may correct for the fact that the samples from step 740 are outliers for the variable values. For example, correcting for the MIS biasing of steps 740-750 may involve the process described above in connection with step 260 of the method 200 (e.g., considering Equations 1-3 and the weighting function $W_i = f(x)/g(x)$). Following optional step 760, the method 700 proceeds to step 795 where the method ends.

It should be noted that although not explicitly specified, one or more steps of the methods 200 or 700 described herein may include a storing, displaying and/or outputting step as required for a particular application. In other words, any data, records, fields, and/or intermediate results discussed in the method(s) can be stored, displayed, and/or outputted to another device as required for a particular application. Furthermore, steps or blocks in the accompanying Figures that recite a determining operation or involve a decision, do not necessarily require that both branches of the determining operation be practiced. In other words, one of the branches of the determining operation can be deemed as an optional step.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowcharts and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the functions/acts specified in the flowcharts and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowcharts and/or block diagram block or blocks.

Referring now to FIGS. 2 and 7, the flowcharts/blocks diagram in the Figures illustrate the architecture, functionality, and operation of possible implementations of systems, methods and computer program products according to various embodiments of the present disclosure. In this regard, each block in the flowcharts or block diagrams may represent a module, segment, or portion of code, which comprises one or more executable instructions for implementing the specified logical function(s). It should also be noted that, in some alternative implementations, the functions noted in the blocks may occur out of the order noted in the Figure. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

Figure 8:
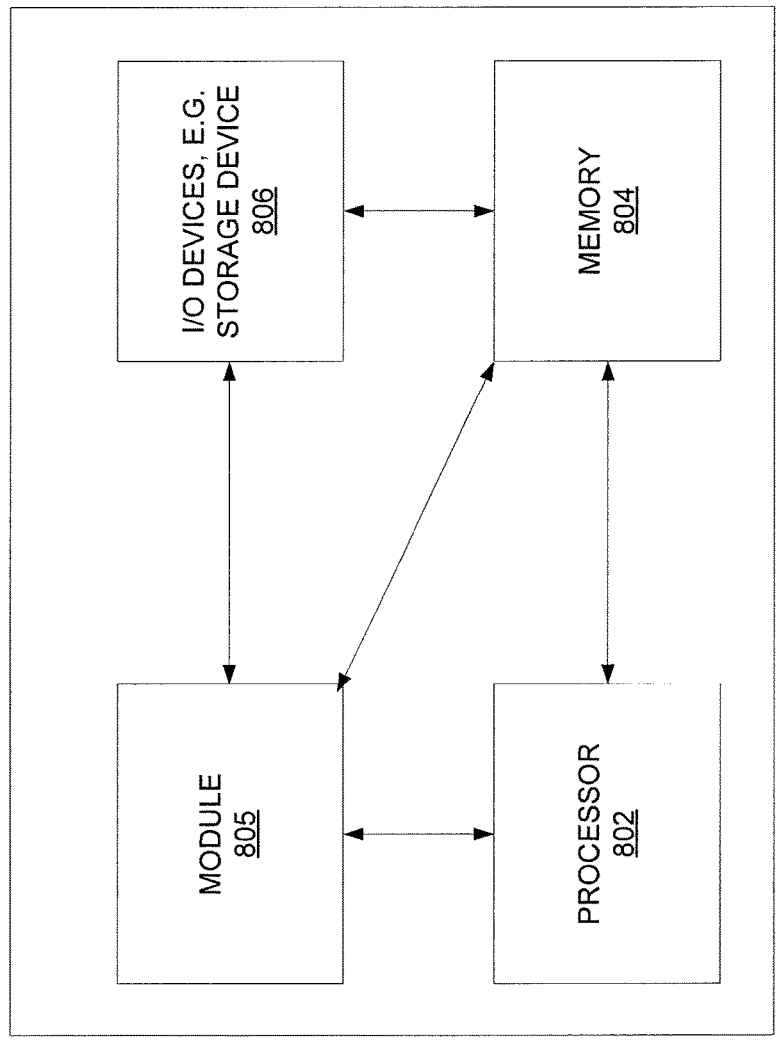
FIG. 8 is a high-level block diagram of a general purpose computing device suitable for use in performing the functions described herein.

FIG. 8 is a high-level block diagram of a general purpose computing device 800 for performing the steps, functions and/or operations described herein, e.g., in connection with the exemplary methods 200 and 700 of FIGS. 2 and 7 respectively. In one embodiment, a general purpose computing device 800 comprises a processor 802, a memory 804, a module 805 for evaluating a system and various input/output (I/O) devices 806 such as a display, a keyboard, a mouse, a stylus, a wireless network access card, and the like. In one embodiment, at least one I/O device is a storage device (e.g., a disk drive, an optical disk drive, a floppy disk drive, a path selection tool, and/or a test pattern generation tool). It should be understood that the module 805 can be implemented as a physical device or subsystem that is coupled to a processor through a communication channel.

Alternatively, the module 805 can be represented by one or more software applications (or even a combination of software and hardware, e.g., using Application Specific Integrated Circuits (ASIC)), where the software is loaded from a storage medium (e.g., I/O devices 806) and operated by the processor 802 in the memory 804 of the general purpose computing device 800. Thus, in one embodiment, the module 805 for evaluating a system, as described herein with reference to the preceding Figures, can be stored on a computer readable storage device (e.g., RAM, magnetic or optical drive or diskette, and the like).

While the foregoing is directed to embodiments of the present disclosure, other and further embodiments of the disclosure may be devised without departing from the basic scope thereof. Various embodiments presented herein, or portions thereof, may be combined to create further embodiments. Furthermore, terms such as top, side, bottom, front, back, and the like are relative or positional terms and are used with respect to the exemplary embodiments illustrated in the figures, and as such these terms may be interchangeable.

What is claimed is:

1. A method comprising:
   constructing, by a processor, a model of a design for an integrated circuit, where the model defines a boundary between at least one failure region and a non-failure region for a performance indicator with respect to at least one variable, wherein the model comprises a multiple order polynomial equation, the multiple order polynomial equation includes a plurality of variables including the at least one variable, where each variable of the plurality of variables represents a different device parameter of the integrated circuit, the constructing comprises model fitting using a sparse regression methodology that elects to maintain terms in the multiple order polynomial equation that have a greater impact on the performance indicator and discards terms that have a lesser impact on the performance indicator, and the model fitting using the sparse regression methodology includes performing a sensitivity analysis to determine an extent of an impact of the at least one variable on the performance indicator, and wherein the performance indicator comprises a failure criterion with respect to the integrated circuit;

obtaining, by the processor, importance samples for the at least one variable, wherein the importance samples are biased to the at least one failure region; and calculating, by the processor, indicator values for the performance indicator of the integrated circuit by solving the multiple order polynomial equation using at least one of the importance samples as a value for the variable;

generating, by the processor, a predicted integrated circuit yield for the design, based on the indictor values; and adjusting, by the processor, the at least one variable based on the predicted integrated circuit yield to produce an adjusted design for the integrated circuit, wherein a yield for a batch of integrated circuits that is fabricated based on the adjusted design is improved with respect to the predicted integrated circuit yield.

2. The method of claim 1, further comprising:
generating a plurality of samples of the at least one variable, wherein each of the plurality of samples of the at least one variable is selected from a range of potential values for at least one system parameter; and
determining initial indicator values for the performance indicator of the system by running a simulation of the system with the plurality of samples to generate the initial indicator values.

3. The method of claim 2, wherein the simulation of the integrated circuit comprises a simulation programs with integrated circuit emphasis (SPICE) model of the design for the integrated circuit.

4. The method of claim 3, wherein the at least one system parameter comprises at least one device parameter of the design for the integrated circuit, wherein the running the simulation of the system comprises utilizing a lookup table to estimate an indicator value of the performance indicator for a given value of the at least one system parameter from a first value in the lookup table that is nearest to the given value.

5. The method of claim 1, further comprising:
generating a plurality of samples via uniform sampling from a distribution of the at least one variable; and
determining indicator values for the performance indicator by running a simulation using the plurality of samples, wherein the indicator values define the at least one failure region and the non-failure region.

6. The method of claim 1, wherein the obtaining the importance samples comprises obtaining the importance samples via mixture importance sampling.

7. The method of claim 6, wherein the mixture importance sampling comprises obtaining the importance samples for the at least one variable using Gaussian random sampling within the range of potential values, wherein the Gaussian random sampling utilizes a Gaussian distribution centered on the at least one failure region.

8. The method of claim 1, wherein a number of terms that are kept and a number of terms that are discarded are selected based upon a desired accuracy of a yield analysis or a desired maximum operating duration of a yield analysis.

9. The method of claim 1, wherein the performance indicator comprises a failure or success criterion, wherein each of the indicator values corresponds to one of a failure or a success.

10. The method of claim 1, wherein the generating comprises:
correcting for the importance samples that are biased to the at least one failure region.

11. A non-transitory computer-readable storage medium storing instructions which, when executed by a processor, cause the processor to perform operations comprising:
constructing a model of a design for an integrated circuit, where the model defines a boundary between at least one failure region and a non-failure region for a performance indicator with respect to at least one variable, wherein the model comprises a multiple order polynomial equation, the multiple order polynomial equation includes a plurality of variables including the at least one variable, where each variable of the plurality of variables represents a different device parameter of the integrated circuit, the constructing comprises model fitting using a sparse regression methodology that elects to maintain terms in the multiple order polynomial equation that have a greater impact on the performance indicator and discards terms that have a lesser impact on the performance indicator, and the model fitting using the sparse regression methodology includes performing a sensitivity analysis to determine an extent of an impact of the at least one variable on the performance indicator, and wherein the performance indicator comprises a failure criterion with respect to the integrated circuit;

obtaining importance samples for the at least one variable, wherein the importance samples are biased to the at least one failure region; and calculating indicator values for the performance indicator of the integrated circuit by solving the multiple order polynomial equation using at least one of the importance samples as a value for the variable;

generating a predicted integrated circuit yield for the design, based on the indictor values; and adjusting the at least one variable based on the predicted integrated circuit yield to produce an adjusted design for the integrated circuit, wherein a yield for a batch of integrated circuits that is fabricated based on the adjusted design is improved with respect to the predicted integrated circuit yield.

12. The non-transitory computer-readable storage medium of claim 11, wherein the operations further comprise:
generating a plurality of samples of the at least one variable, wherein each of the plurality of samples of the at least one variable is selected from a range of potential values for at least one system parameter; and
determining initial indicator values for the performance indicator of the system by running a simulation of the system with the plurality of samples to generate the initial indicator values.

13. The non-transitory computer-readable storage medium of claim 11, wherein the obtaining the importance samples comprises obtaining the importance samples via mixture importance sampling.

14. The non-transitory computer-readable storage medium of claim 11, wherein the performance indicator comprises a failure or success criterion, wherein each of the indicator values corresponds to one of a failure or a success.

15. A device for evaluating a system, comprising:
a processor; and
a non-transitory computer-readable medium storing instructions which, when executed by the processor, cause the processor to perform operations, the operations comprising:
constructing a model of a design for an integrated circuit, where the model defines a boundary between at least one failure region and a non-failure region for a performance indicator with respect to at least one variable, wherein the model comprises a multiple order polynomial equation, the multiple order polynomial equation includes a plurality of variables including the at least one variable, where each variable of the plurality of variables represents a different device parameter of the integrated circuit, the constructing comprises model fitting using a sparse regression methodology that elects to maintain terms in the multiple order polynomial equation that have a greater impact on the performance indicator and discards terms that have a lesser impact on the performance indicator, and the model fitting using the sparse regression methodology includes performing a sensitivity analysis to determine an extent of an impact of the at least one variable on the performance indicator, and wherein the performance indicator comprises a failure criterion with respect to the integrated circuit;
obtaining importance samples for the at least one variable, wherein the importance samples are biased to the at least one failure region; and
calculating indicator values for the performance indicator of the integrated circuit by solving the multiple order polynomial equation using at least one of the importance samples as a value for the variable;
generating a predicted integrated circuit yield for the design, based on the indictor values; and
adjusting the at least one variable based on the predicted integrated circuit yield to produce an adjusted design for the integrated circuit, wherein a yield for a batch of integrated circuits that is fabricated based on the adjusted design is improved with respect to the predicted integrated circuit yield.

* * * * *